United States Patent
Ham et al.

(10) Patent No.: US 12,141,446 B2
(45) Date of Patent: Nov. 12, 2024

(54) MEMORY DEVICE FOR INDIVIDUALLY APPLYING VOLTAGES TO WORD LINES ADJACENT TO SELECTED WORD LINE, AND OPERATING METHOD THEREOF

(71) Applicant: SAMSUNG ELECTRONICS CO., LTD., Suwon-si (KR)

(72) Inventors: Dae Sik Ham, Suwon-si (KR); Sanghun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 84 days.

(21) Appl. No.: 17/951,712

(22) Filed: Sep. 23, 2022

(65) Prior Publication Data
US 2023/0152982 A1 May 18, 2023

(30) Foreign Application Priority Data

Nov. 18, 2021 (KR) .......................... 10-2021-0159134
May 6, 2022 (KR) .......................... 10-2022-0056275

(51) Int. Cl.
G06F 12/00 (2006.01)
G06F 3/06 (2006.01)
G06F 13/00 (2006.01)

(52) U.S. Cl.
CPC .......... G06F 3/0619 (2013.01); G06F 3/0629 (2013.01); G06F 3/0679 (2013.01)

(58) Field of Classification Search
CPC ..... G06F 3/0619; G06F 3/0629; G06F 3/0679
USPC ....................................................... 711/154
See application file for complete search history.

(56) References Cited

U.S. PATENT DOCUMENTS

| | | | | |
|---|---|---|---|---|
| 5,657,282 A * | 8/1997 | Lee | ......................... | G11C 29/50 365/194 |
| 7,623,386 B2 * | 11/2009 | Dong | ................. | G11C 16/0483 365/185.26 |
| 8,274,831 B2 * | 9/2012 | Mokhlesi | ........... | G11C 16/0483 365/185.28 |
| 10,410,728 B2 * | 9/2019 | Shim | ................... | G11C 16/0483 |
| 10,490,244 B2 * | 11/2019 | Oh | ......................... | G11C 16/26 |
| 10,522,232 B2 * | 12/2019 | Chen | ................... | H01L 29/7884 |
| 10,770,157 B1 * | 9/2020 | Chen | ........................ | G11C 16/26 |
| 10,902,925 B1 * | 1/2021 | Lien | ....................... | G11C 16/10 |
| 11,264,101 B2 | 3/2022 | Wang et al. | | |
| 2006/0198221 A1 * | 9/2006 | Rudeck | .............. | G11C 16/3427 365/206 |
| 2008/0019188 A1 * | 1/2008 | Li | ...................... | G11C 16/3454 365/185.22 |

(Continued)

FOREIGN PATENT DOCUMENTS

KR    10-2021-0099657 A    8/2021

*Primary Examiner* — Sheng Jen Tsai
(74) *Attorney, Agent, or Firm* — Sughrue Mion, PLLC

(57) ABSTRACT

A memory device includes a memory block including a first adjacent word line, a selected word line, and a second adjacent word line provided in a direction perpendicular to a substrate and an address decoding circuit. In a first setup period in which the selected word line is set up, the address decoding circuit is configured to apply a first pre-setup voltage to the first adjacent word line, apply a first setup voltage that is higher than the first pre-setup voltage to the first adjacent word line, apply a second pre-setup voltage to the second adjacent word line, and apply a second setup voltage that is higher than the second pre-setup voltage to the second adjacent word line. The first pre-setup voltage is higher than the second pre-setup voltage.

20 Claims, 8 Drawing Sheets

(56) References Cited

U.S. PATENT DOCUMENTS

| | | | |
|---|---|---|---|
| 2008/0160680 A1* | 7/2008 | Yuan | H10B 69/00 438/266 |
| 2008/0278999 A1* | 11/2008 | Dong | G11C 16/3418 365/185.02 |
| 2009/0073771 A1* | 3/2009 | Li | G11C 11/5628 365/185.22 |
| 2010/0097861 A1* | 4/2010 | Dutta | G11C 11/5628 365/185.17 |
| 2010/0149877 A1* | 6/2010 | Kim | G11C 16/04 365/185.23 |
| 2010/0165738 A1* | 7/2010 | Cernea | G11C 16/26 365/185.21 |
| 2010/0165743 A1* | 7/2010 | Cernea | G11C 11/5642 365/185.21 |
| 2011/0026331 A1* | 2/2011 | Dong | G11C 16/0483 365/185.19 |
| 2011/0032757 A1* | 2/2011 | Dutta | G11C 16/3427 365/189.05 |
| 2011/0286265 A1* | 11/2011 | Mokhlesi | G11C 16/10 365/185.02 |
| 2014/0254262 A1* | 9/2014 | Chen | G11C 16/3427 365/185.12 |
| 2015/0046770 A1* | 2/2015 | Luo | G06F 11/1402 714/764 |
| 2016/0093390 A1* | 3/2016 | Yuan | G11C 16/3459 714/764 |
| 2018/0012667 A1* | 1/2018 | Costa | G11C 16/0483 |
| 2019/0311772 A1* | 10/2019 | Diep | G11C 16/08 |
| 2019/0355429 A1* | 11/2019 | Chen | G11C 16/08 |
| 2021/0201982 A1 | 7/2021 | Choi et al. | |
| 2021/0304822 A1* | 9/2021 | Lien | G11C 16/26 |

\* cited by examiner

MEMORY DEVICE FOR INDIVIDUALLY APPLYING VOLTAGES TO WORD LINES ADJACENT TO SELECTED WORD LINE, AND OPERATING METHOD THEREOF

CROSS-REFERENCE TO RELATED APPLICATIONS

This application is based on and claims priority under 35 U.S.C. § 119 to Korean Patent Application No. 10-2021-0159134, filed on Nov. 18, 2021, and Korean Patent Application No. 10-2022-0056275, filed on May 6, 2022, in the Korean Intellectual Property Office, the disclosures of which are incorporated by reference herein in their entireties.

BACKGROUND

1. Field

Example embodiments of the present disclosure relate to a memory device, and more particularly, to a memory device individually applying word lines adjacent to a selected word line.

2. Description of Related Art

A semiconductor memory device may be classified as a volatile memory device, in which stored data disappear when a power supply is turned off, such as a static random access memory (SRAM) or a dynamic random access memory (DRAM), or a nonvolatile memory device, in which stored data are retained even when a power supply is turned off, such as a flash memory device, a phase-change RAM (PRAM), a magnetic RAM (MRAM), a resistive RAM (RRAM), or a ferroelectric RAM (FRAM).

A three-dimensional semiconductor memory device may include a cell string that is implemented by stacking memory cells in a direction perpendicular to a substrate for the purpose of improving the degree of integration. However, as the degree of integration of the three-dimensional semiconductor memory device is improved, the number of word lines connected with one memory block is increasing. There is a need to decrease program operation speed without the reduction of reliability during a program operation.

SUMMARY

Provided are a memory device individually applying word lines adjacent to a selected word line, and an operating method thereof.

Additional aspects will be set forth in part in the description which follows and, in part, will be apparent from the description, or may be learned by practice of the presented embodiments.

According to an aspect of an example embodiment, a memory device may include a memory block including a first adjacent word line, a selected word line, and a second adjacent word line provided in a direction perpendicular to a substrate and an address decoding circuit. In a first setup period in which the selected word line is set up, the address decoding circuit may be configured to apply a first pre-setup voltage to the first adjacent word line, apply a first setup voltage that is higher than the first pre-setup voltage to the first adjacent word line, apply a second pre-setup voltage to the second adjacent word line, and apply a second setup voltage that is higher than the second pre-setup voltage to the second adjacent word line. The first pre-setup voltage may be higher than the second pre-setup voltage.

According to an aspect of an example embodiment, a method of operating a memory device that includes a first adjacent word line, a selected word line, and a second adjacent word line provided in a direction perpendicular to a substrate, may include applying a first pre-setup voltage to the first adjacent word line in a first setup period in which the selected word line is set up, applying a second pre-setup voltage to the second adjacent word line in the first setup period, applying a first setup voltage that is higher than the first pre-setup voltage to the first adjacent word line in the first setup period, and applying a second setup voltage that is higher than the second pre-setup voltage to the second adjacent word line in the first setup period. The first pre-setup voltage may be higher than the second pre-setup voltage.

According to an aspect of an example embodiment, a memory device may include a memory block including a first adjacent word line, a selected word line, and a second adjacent word line provided in a direction perpendicular to a substrate, and an address decoding circuit configured to set up the selected word line in a first period between a start time point and an end time point, apply a first pre-setup voltage to the first adjacent word line in a second period between the start time point and a first time point, apply a first setup voltage that is higher than the first pre-setup voltage to the first adjacent word line in a third period between the first time point and the end time point, apply a second pre-setup voltage to the second adjacent word line in a fourth period between the start time point and a second time point, and apply a second setup voltage that is higher than the second pre-setup voltage to the second adjacent word line in a fifth period between the second time point and the end time point. The first pre-setup voltage may be higher than the second pre-setup voltage.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Example embodiments of the present disclosure will be described in detail and clearly to such an extent that one skilled in the art easily carries out the present disclosure. With regard to the description of the present disclosure, to make the overall understanding easy, like components will be marked by like reference signs/numerals in drawings, and thus, additional description will be omitted to avoid redundancy.

In a conventional memory device, a memory cell of an erase state, which is connected with a selected word line, may be programmed due to hot electron injection (HCI) that occurs due to a voltage difference of upper and lower adjacent word lines located above and below the selected word line.

In example embodiments, a first pre-setup voltage higher than a read voltage of a seventh program state (or last program state, highest program state, nth program state of n program states, etc.) of memory cells connected with the selected word line may be applied to the upper adjacent word line, and thus, a channel-off period may not occur in a channel corresponding to memory cells connected with the upper adjacent word line. Thus, the HCI may be prevented.

Furthermore, times at which a first setup voltage and a second setup voltage are applied may be adjusted, and thus, program operation speed of the selected word line may be improved. Additionally, the program operation speed of the selected word line may be improved by making a level difference of the first pre-setup voltage and the first setup voltage great.

Figure 1:
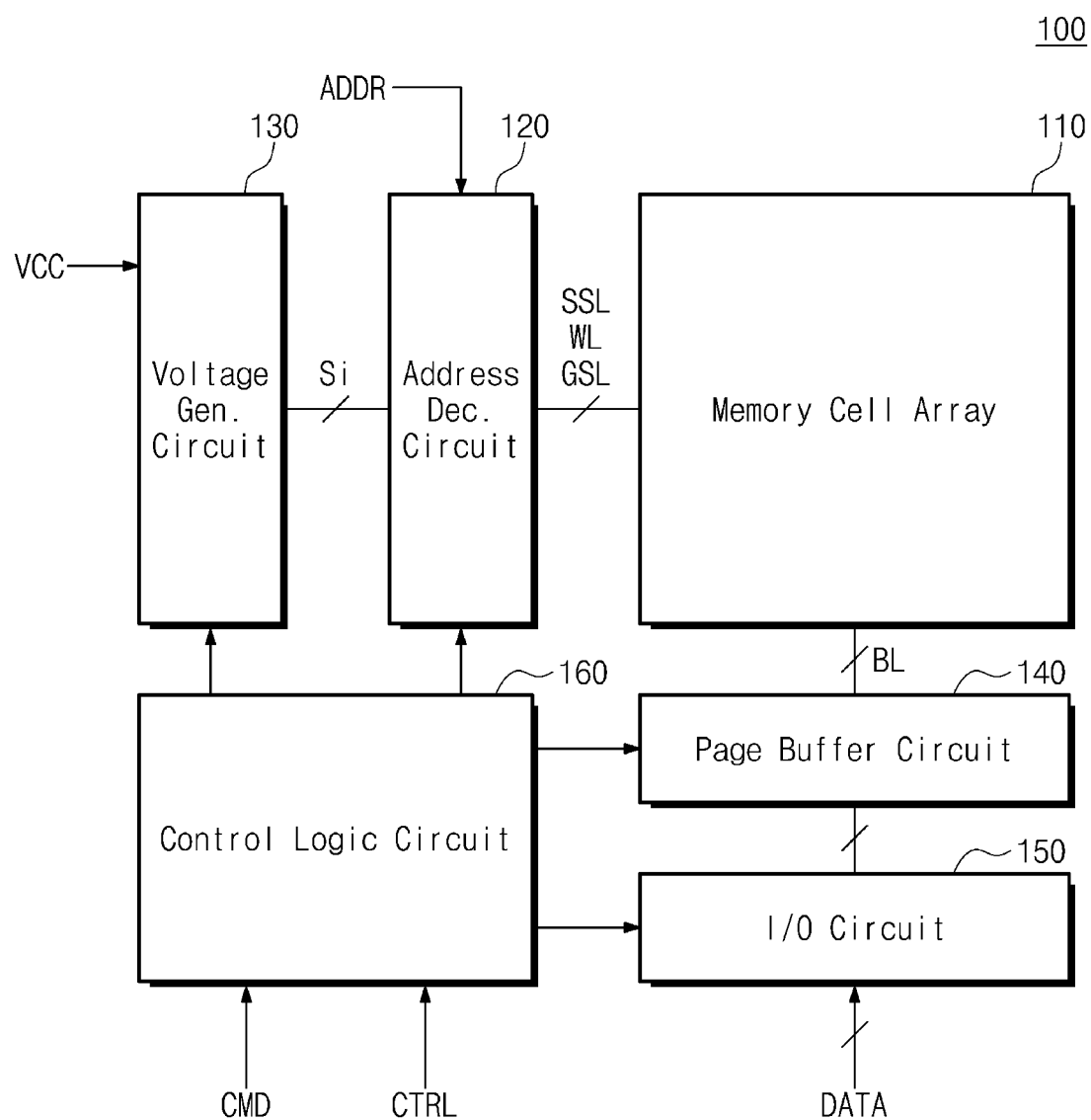
FIG. 1 is a block diagram of a memory device according to an example embodiment.

FIG. 1 is a block diagram of a memory device according to an example embodiment. In some embodiments, a memory device 100 may be a nonvolatile memory device that is based on a NAND flash memory. However, the present disclosure is not limited thereto. For example, the memory device 100 may be one of various types of memory devices such as a dynamic random access memory (DRAM), a static RAM (SRAM), a phase-change RAM (PRAM), a magnetoresistive RAM (MRAM), a resistive RAM (RRAM), and a ferroelectric RAM (FRAM).

Referring to FIG. 1, the memory device 100 may include a memory cell array 110, an address decoding circuit 120, a voltage generation circuit 130, a page buffer circuit 140, an input/output circuit 150, and a control logic circuit 160.

The memory cell array 110 may include a plurality of memory blocks. Each of the plurality of memory blocks may include a plurality of cell strings. Each of the plurality of cell strings may include a plurality of cell transistors connected in series between a bit lines BL and a common source line. The plurality of cell transistors may be connected with string selection lines SSL, word lines WL, and ground selection lines GSL. A structure of the plurality of memory blocks will be described in detail with reference to FIG. 2.

The address decoding circuit 120 may be connected with the memory cell array 110 through the string selection lines SSL, the word lines WL, and the ground selection lines GSL. The address decoding circuit 120 may receive an address ADDR from an external device (e.g., a memory controller) and may decode the received address ADDR. The address decoding circuit 120 may control voltages of the string selection lines SSL, the word lines WL, and the ground selection lines GSL based on a decoding result.

In detail, during a setup period (i.e., in a setup period, within a setup period, throughout a setup period, etc.) of a selected word line of the word lines WL, the address decoding circuit 120 may apply a first pre-setup voltage to an upper adjacent word line and may then apply a first setup voltage higher than the first pre-setup voltage to the upper adjacent word line.

During the setup period of the selected word line of the word lines WL, the address decoding circuit 120 may apply a second pre-setup voltage to a lower adjacent word line and may then apply a second setup voltage higher than the second pre-setup voltage to the lower adjacent word line. This will be described in more detail with reference to FIG. 3.

The selected word line may refer to a word line targeted for a program operation of a memory device. The upper adjacent word line and the lower adjacent word line may refer to word lines adjacent to the selected word line. The upper adjacent word line may refer to a word line located on an upper side of the selected word line (or above the selected word line). The lower adjacent word line may refer to a word line located on a lower side of the selected word line (or below the selected word line).

The setup period of the selected word line may refer to a period in which a voltage necessary to perform the program operation is applied to a selected word line (e.g., WL2) before the program operation is performed on the selected word line (e.g., WL2).

The voltage generation circuit 130 may generate various voltages necessary for the memory device 100 to operate. For example, the voltage generation circuit 130 may generate various voltages based on a power supply voltage VCC, such as a plurality of program voltages, a plurality of pass voltages, a plurality of verify voltages, a plurality of selection read voltages, a plurality of non-selection read voltages, a plurality of erase voltages, and a plurality of erase verify voltages. In some embodiments, the voltage generation circuit 130 may generate the first pre-setup voltage, the first setup voltage, the second pre-setup voltage, and the second setup voltage.

The page buffer circuit 140 may be connected with the memory cell array 110 through bit lines BL. The page buffer circuit 140 may read data stored in the memory cell array 110 by sensing voltage changes of the bit lines BL and may temporarily store the read data. The page buffer circuit 140 may receive data from the input/output circuit 150 and may store the received data in the memory cell array 110 by controlling the bit lines BL based on the received data.

The input/output circuit 150 may exchange data "DATA" with the external device (e.g., a memory controller). For example, the input/output circuit 150 may receive the data "DATA" from the external device and may provide the received data "DATA" to the page buffer circuit 140. The input/output circuit 150 may receive the data "DATA" from the page buffer circuit 140 and may output the received data "DATA" to the external device.

The control logic circuit 160 may control an overall operation of the memory device 100. For example, the control logic circuit 160 may receive a command CMD and a control signal CTRL from the external device (e.g., a memory controller) and may control various operations (e.g., a program operation, a read operation, and an erase operation) of the memory device 100 based on the received signals.

Below, to describe embodiments of the present disclosure, the embodiments of the present disclosure will be described based on the read operation of the memory device 100.

However, the present disclosure is not limited thereto. For example, it may be understood that the embodiments of the present disclosure may be applied to a word line setup operation or various operations (e.g., a program operation, a verify operation, and an erase operation) of the memory device 100, in which any other operation voltages are generated.

Figure 2:
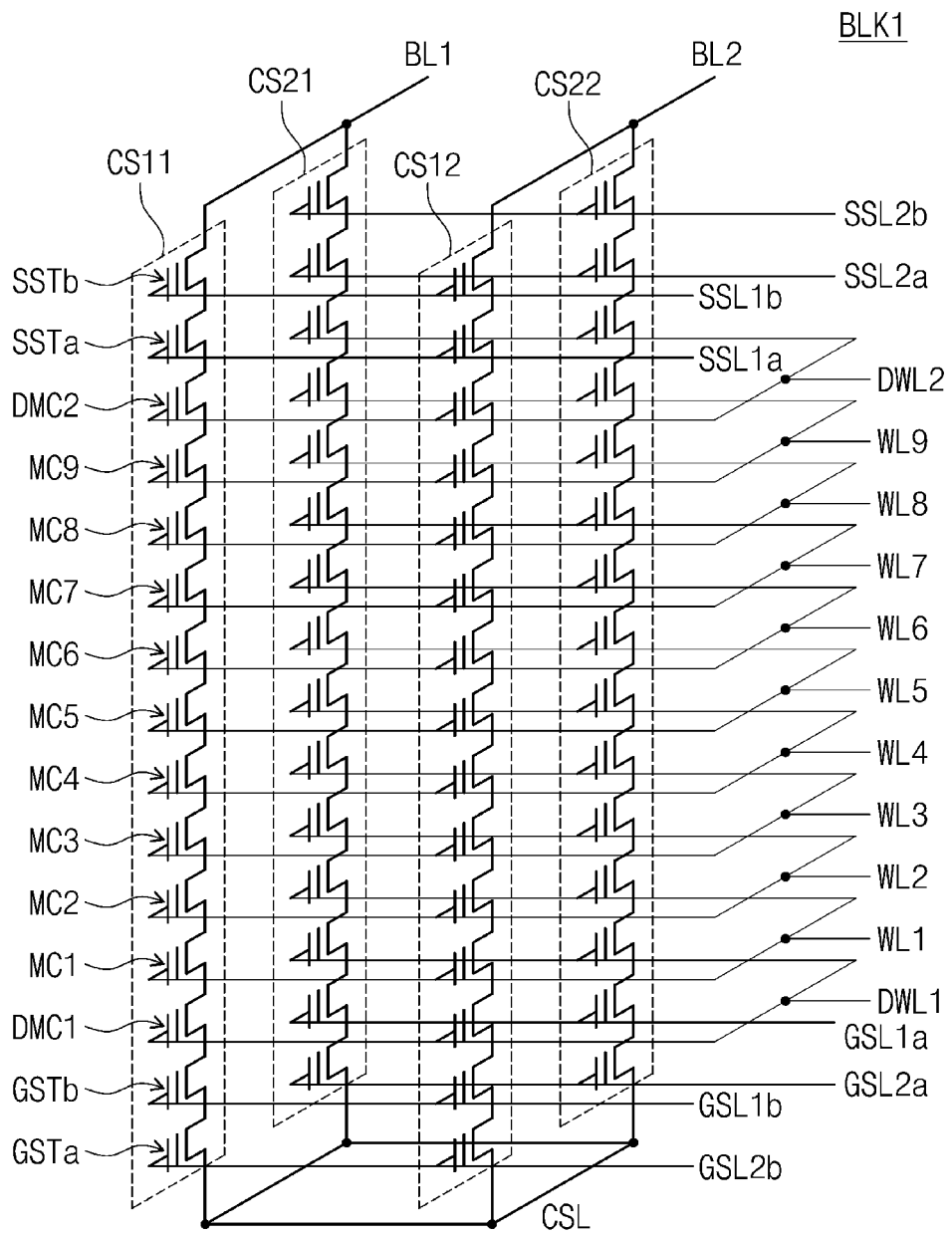
FIG. 2 is a diagram illustrating a first memory block of a plurality of memory blocks included in a memory cell array in FIG. 1 according to an example embodiment.

FIG. 2 is a diagram illustrating a first memory block of a plurality of memory blocks included in a memory cell array in FIG. 1 according to an example embodiment. In some embodiments, the memory device 100 of FIG. 1 may be a flash memory device that includes a plurality of memory blocks.

A memory block of a three-dimensional structure will be described with reference to FIG. 2, but the present disclosure is not limited thereto. The memory block according to the present disclosure may have a two-dimensional memory block structure. A first memory block BLK1 will be described with reference to FIG. 2, but the present disclosure is not limited thereto. The remaining memory blocks may be similar in structure to the first memory block BLK1.

In some embodiments, the first memory block BLK1 may correspond to a physical erase unit of the memory device 100. However, the present disclosure is not limited thereto. For example, the erase unit may be changed to a page unit, a word line unit, a sub-block unit, etc.

The first memory block BLK1 may include a plurality of cell strings CS11, CS12, CS21, and CS22. The plurality of cell strings CS11, CS12, CS21, and CS22 may be arranged in a row direction and a column direction to form rows and columns.

Each of the plurality of cell strings CS11, CS12, CS21, and CS22 includes a plurality of cell transistors. For example, each of the plurality of cell strings CS11, CS12, CS21, and CS22 may include string selection transistors SSTa and SSTb, a plurality of memory cells MC1 to MC9, ground selection transistors GSTa and GSTb, and dummy memory cells DMC1 and DMC2. In an embodiment, each of a plurality of cell transistors included in the cell strings CS11, CS12, CS21, and CS22 may be a charge trap flash (CTF) memory cell.

In each cell string, the plurality of memory cells MC1 to MC9 are serially connected and are stacked in a direction perpendicular to a plane defined by the row direction and the column direction, that is, in a height direction. The string selection transistors SSTa and SSTb are serially connected, and the serially-connected string selection transistors SSTa and SSTb are interposed between a bit line BL1 or BL2 and the plurality of memory cells MC1 to MC9. The ground selection transistors GSTa and GSTb may be serially connected with each other, and the serially-connected ground selection transistors GSTa and GSTb may be interposed between the plurality of memory cells MC1 to MC9 and a common source line CSL.

In some embodiments, the first dummy memory cell DMC1 may be interposed between the plurality of memory cells MC1 to MC9 and the ground selection transistors GSTa and GSTb. In some embodiments, the second dummy memory cell DMC2 may be interposed between the plurality of memory cells MC1 to MC9 and the string selection transistors SSTa and SSTb.

The ground selection transistors GSTa and GSTb of the cell strings CS11, CS12, CS21, and CS22 may be connected in common with a ground selection line GSL. In some embodiments, ground selection transistors in the same row may be connected with the same ground selection line, and ground selection transistors in different rows may be connected with different ground selection lines. For example, the first ground selection transistors GSTa of the cell strings CS11 and CS12 in the first row may be connected with a first ground selection line, and the first ground selection transistors GSTa of the cell strings CS21 and CS22 in the second row may be connected with a second ground selection line.

In some embodiments, ground selection transistors provided at the same height from a substrate may be connected with the same ground selection line, and ground selection transistors provided at different heights therefrom may be connected with different ground selection lines.

Memory cells of the same height from the substrate or the ground selection transistors GSTa and GSTb are connected in common with the same word line, and memory cells of different heights therefrom are connected with different word lines. For example, the plurality of memory cells MC1 to MC9 of the cell strings CS11, CS12, CS21, and CS22 may be connected with a plurality of word lines WL1 to WL9.

String selection transistors, which belong to the same row, from among the first string selection transistors SSTa of the same height are connected with the same string selection line, and string selection transistors belonging to different rows are connected with different string selection lines. For example, the first string selection transistors SSTa of the cell strings CS11 and CS12 in the first row may be connected in common to a string selection line SSL1a, and the first string selection transistors SSTa of the cell strings CS21 and CS22 in the second row may be connected in common to a string selection line SSL2a.

Likewise, second string selection transistors, which belong to the same row, from among the second string selection transistors SSTb at the same height are connected with the same string selection line, and second string selection transistors in different rows are connected with different string selection lines. For example, the second string selection transistors SSTb of the cell strings CS11 and CS12 in the first row are connected in common with a string selection line SSL1b, and the second string selection transistors SSTb of the cell strings CS21 and CS22 in the second row may be connected in common with a string selection line SSL2b.

In some embodiments, dummy memory cells at the same height may be connected with the same dummy word line, and dummy memory cells at different heights may be connected with different dummy word lines. For example, the first dummy memory cells DMC1 may be connected with a first dummy word line DWL1, and the second dummy memory cells DMC2 may be connected with a second dummy word line DWL2.

In some embodiments, the first memory block BLK1 illustrated in FIG. 2 is only an example. The number of cell strings may increase or decrease, and the number of rows of cell strings and the number of columns of cell strings may increase or decrease depending on the number of cell strings. Also, the number of cell transistors (i.e., GST, MC, DMC, and SST) of the first memory block BLK1 may increase or decrease, and the height of the first memory block BLK1 may increase or decrease depending on the number of cell transistors. In addition, the number of lines (i.e., GSL, WL, DWL, and SSL) connected with cell transistors may increase or decrease depending on the number of cell transistors.

As a memory cell distant from the substrate is first programmed, a channel of a cell string may be separated and boosted when a memory cell close to the substrate is programmed. As such, a potential difference may occur between the boosted channels, and the HCI may occur due to the potential difference of the boosted channels. The HCI may be prevented in the program operation of a selected word line by adjusting voltages respectively applied to word lines adjacent to the selected word line. This will be described in more detail with reference to FIG. 3.

Figure 3:
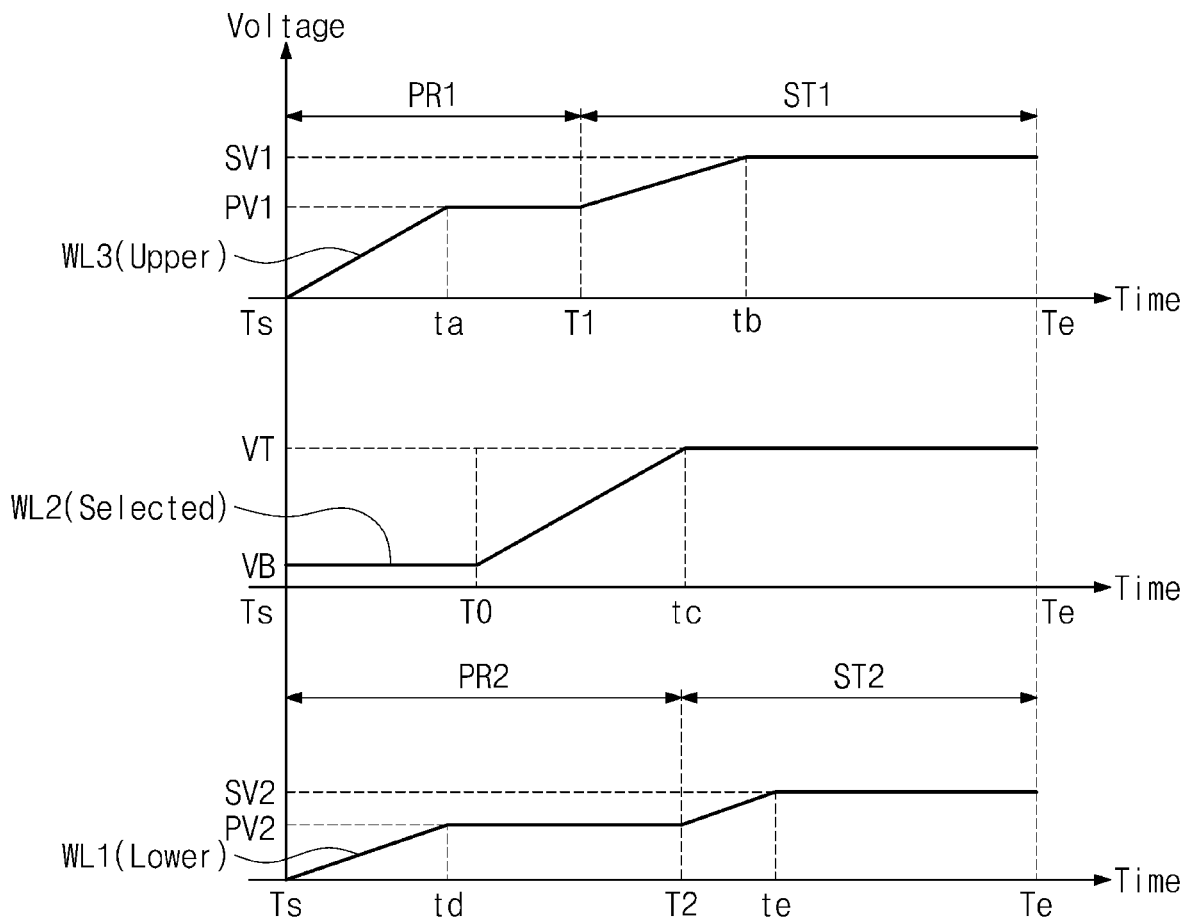
FIG. 3 is a graph of voltages applied to a selected word line, an upper adjacent word line, and a lower adjacent word line, according to an example embodiment.

FIG. 3 is a graph of voltages applied to a selected word line, an upper adjacent word line, and a lower adjacent word line, according to an example embodiment. Referring to FIG. 3, different voltages are respectively applied to a selected word line WL2, an upper adjacent word line WL3, and a lower adjacent word line WL1. In FIG. 3, a horizontal axis denotes a time, and a vertical axis denotes a magnitude of a voltage.

Referring to FIG. 2, the selected word line WL2 may be the second word line WL2. The upper adjacent word line WL3 may be the third word line WL3 upwardly adjacent to the second word line WL2. The lower adjacent word line WL1 may be the first word line WL1 downwardly adjacent to the second word line WL2. The lower adjacent word line WL1 may be closer to the substrate than the upper adjacent word line WL3. In some embodiments, the upper adjacent word line WL3 may be in a state where the program operation is completed, and the lower adjacent word line WL1 may be in an erase state.

An address decoding circuit may perform the setup operation for the program operation of the selected word line WL2 during a word line setup period between a start time point Ts and an end time point Te. The setup operation may refer to an operation of applying a voltage necessary to perform the program operation to the selected word line WL2 before the program operation of the selected word line WL2 is performed.

The address decoding circuit may apply a boosting voltage VB to the selected word line WL2 during a period from the start time point Ts to time point T0. The boosting voltage VB may be a voltage that is higher than a voltage applied to the selected word line WL2 before the setup period.

The address decoding circuit may apply a write voltage VT for the program operation to the selected word line WL2 at the time point T0. The write voltage VT may have a target voltage level of the selected word line WL2 to be applied for programming. The write voltage VT may be higher than the boosting voltage VB. A voltage level of the selected word line WL3 may reach a level of the write voltage VT at time point tc.

During the setup period (or word line setup period), the address decoding circuit may apply a voltage to each of the upper adjacent word line WL3 and the lower adjacent word line WL1 in two steps. In detail, during a first pre-setup period PR1 between the start time point Ts and a first time point T1, the address decoding circuit may apply a first pre-setup voltage PV1 to the upper adjacent word line WL3. A voltage level of the upper adjacent word line WL3 may reach a level of the first pre-setup voltage PV1 at time point to between the start time point Ts and the first time point T1. In some embodiments, the first pre-setup voltage PV1 may be higher than a read voltage corresponding to a seventh program state of memory cells connected with the upper adjacent word line WL3.

In a conventional memory device, when the program operation is performed with respect to the selected word line WL2, a channel corresponding to a memory cell connected with an upper word line of the selected word line WL2 may be shut off; in this case, a voltage of the channel corresponding to the memory cell connected with the upper word line may be negative.

Also, when the program operation is performed with respect to the selected word line WL2, a channel corresponding to a memory cell connected with a lower word line of the selected word line WL2 may be supplied with a boosting voltage for assisting the program operation of the selected word line WL2; in this case, a voltage of the channel corresponding to the memory cell connected with the lower word line may be positive.

In the case where a voltage difference between the negative voltage of the channel corresponding to the memory cell connected with the upper word line and the positive voltage of the channel corresponding to the memory cell connected with the lower word line is great, a memory cell of an erase state, which is connected with the selected word line WL2, may be programmed by the HCI.

In contrast, a memory device according to the present disclosure may supply the upper adjacent word line WL3 with the first pre-setup voltage PV1 higher than the read voltage of the seventh program state of memory cells connected with the upper adjacent word line WL3, and thus, a channel-off period may not occur in the channel corresponding to memory cells connected with the upper adjacent word line WL3. Accordingly, the HCI may be prevented.

During a first setup period ST1 between the first time point T1 and the end time point Te, the address decoding circuit may apply a first setup voltage SV1 to the upper adjacent word line WL3. A voltage of the upper adjacent word line WL3 may reach the first setup voltage SV1 at time point tb. The first setup voltage SV1 may be higher than the first pre-setup voltage PV1.

In some embodiments, in the case where the HCI degradation characteristic of the selected word line WL2 is good, as a magnitude difference of the first pre-setup voltage PV1 and the first setup voltage SV1 becomes greater, the program operation speed of the selected word line WL2 may become better.

During a second pre-setup period PR2 between the start time point Ts and a second time point T2, the address decoding circuit may apply a second pre-setup voltage PV2 to the lower adjacent word line WL1. A voltage of the lower adjacent word line WL1 may reach the second pre-setup voltage PV2 at time point td. The second pre-setup voltage PV2 may be lower than the first pre-setup voltage PV1.

During a second setup period ST2 between the second time point T2 and the end time point Te, the address decoding circuit may apply a second setup voltage SV2 to the lower adjacent word line WL1. A voltage of the lower adjacent word line WL1 may reach the second setup voltage SV2 at time point te. The second setup voltage SV2 may be higher than the second pre-setup voltage PV2. For example, the second pre-setup voltage PV2 may be between 0 V and 10 V, and the second setup voltage SV2 may be between 7 V and 10 V.

As the second pre-setup voltage PV2 is applied to the lower adjacent word line WL1 during the setup period of the selected word line WL2, the coupling-up effect may be maximized. As such, a speed at which the selected word line WL2 is set up may be improved. Also, as there is improved the speed at which the selected word line WL2 is set up, a time taken to perform the program operation may decrease.

That is, as the first pre-setup voltage PV1 is applied to the upper adjacent word line WL3 during the first pre-setup period PR1, the first setup voltage SV1 is applied to the upper adjacent word line WL3 during the first setup period ST1, the second pre-setup voltage PV2 is applied to the lower adjacent word line WL1 during the second pre-setup period PR2, and the second setup voltage SV2 is applied to the lower adjacent word line WL1 during the second setup period ST2, the hot electron injection (HCI) of the selected word line WL2 may be blocked, and the program operation speed may be improved.

Figure 4:
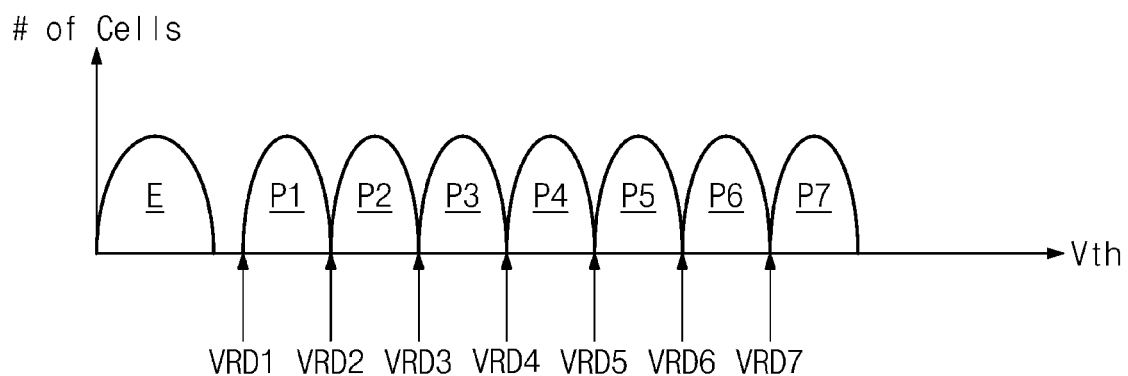
FIG. 4 is a diagram illustrating threshold voltage distributions of memory cells of FIG. 2 according to an example embodiment.

FIG. 4 is a diagram illustrating threshold voltage distributions of memory cells of FIG. 2 according to an example embodiment. Below, to describe embodiments of the present disclosure easily, it is assumed that each of the memory cells of the memory device 100 is a triple level cell (TLC) configured to store 3-bit data. However, the present disclosure is not limited thereto. For example, each memory cell may be a single level cell (SLC) storing 1-bit data, or a multi-level cell (MLC), a TLC, or a quad level cell (QLC) storing n-bit data (n being a natural number more than 1).

Referring to FIGS. 2 and 4, each memory cell may be programmed to have one of an erase state "E" and first to seventh program states P1 to P7. To read data programmed in the memory cells, the memory device 100 may use a plurality of read voltages VRD1 to VRD7. For example, to read data programmed in memory cells connected with a word line, the memory device 100 may sequentially apply the plurality of read voltages VRD1 to VRD7 to the word line. In some embodiments, the plurality of selection read voltages VRD1 to VRD7 may have voltage levels for distinguishing the erase state "E" and the first to seventh program states P1 to P7.

In an embodiment, the first pre-setup voltage PV1 that is applied to the upper adjacent word line WL3 may be higher than the seventh read voltage VRD7 of the upper adjacent word line WL3. The second pre-setup voltage PV2 that is applied to the lower adjacent word line WL1 may be lower than the first read voltage VRD1 of the selected word line WL2.

As the first setup voltage SV1 of the upper adjacent word line WL3 becomes smaller, the program operation speed of the selected word line WL2 may decrease. To prevent the above issue, the first setup voltage SV1 of the upper adjacent word line WL3 may be set to be higher than the first pre-setup voltage PV1.

As the first setup voltage SV1 of the upper adjacent word line WL3 becomes greater, a threshold voltage distribution of memory cells connected with the selected word line WL2 may become wider. In this case, a distance between threshold voltage distributions may decrease. This may mean that the probability that a program fail occurs increases. To prevent the above issue, the first setup voltage SV1 of the upper adjacent word line WL3 may be set to be lower than a first reference voltage. For example, the first reference voltage may be 10 V.

Also, as the second setup voltage SV2 of the lower adjacent word line WL1 becomes smaller, the program operation speed of the selected word line WL2 may decrease. To prevent the above issue, the second setup voltage SV2 of the lower adjacent word line WL1 may be set to be higher than the second pre-setup voltage PV2.

As the second setup voltage SV2 of the lower adjacent word line WL1 becomes greater, a threshold voltage distribution of memory cells connected with the selected word line WL2 may become wider. In this case, a distance between threshold voltage distributions may decrease. This may mean that the probability that a program fail occurs increases. To prevent the above issue, the second setup voltage SV2 of the lower adjacent word line WL1 may be set to be lower than a second reference voltage. For example, the second reference voltage may be 10 V.

Figure 5:
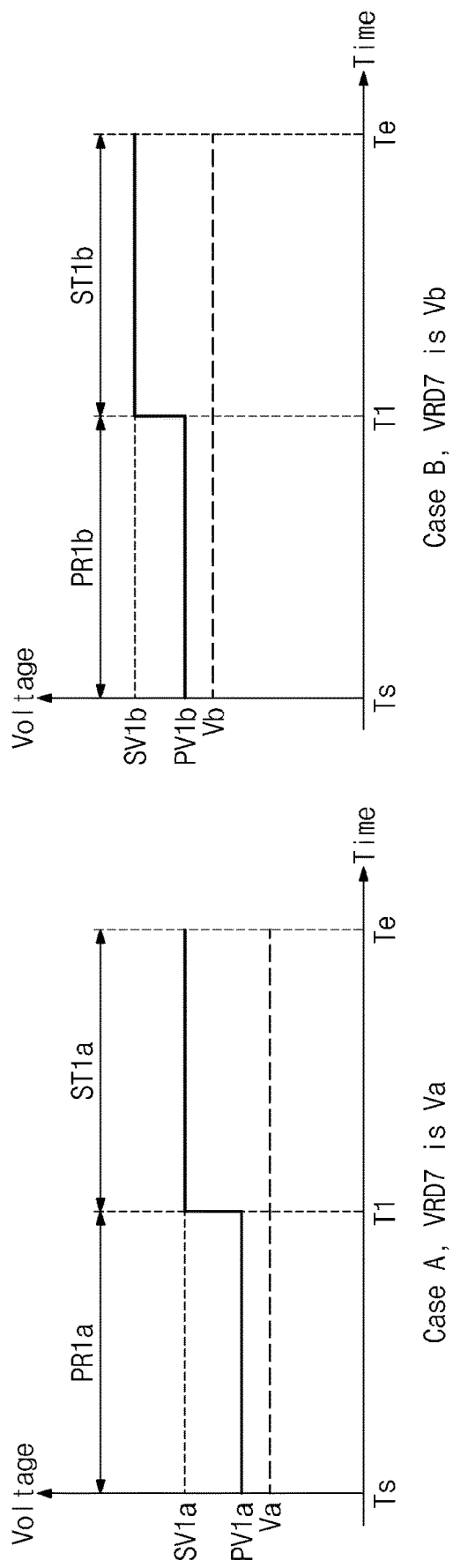
FIG. 5 is a graph of voltages applied to an upper adjacent word line, according to an example embodiment.

FIG. 5 is a graph of voltages applied to an upper adjacent word line, according to an example embodiment. Voltages that are applied to an upper adjacent word line depending on the seventh read voltage VRD7 of the upper adjacent word line are illustrated in FIG. 5. In FIG. 5, a horizontal axis denotes a time, and a vertical axis denotes a magnitude of a voltage.

Referring to Case A in which the seventh read voltage VRD7 of the upper adjacent word line is a first voltage Va, during a first pre-setup period PR1a, the address decoding circuit may apply a first pre-setup voltage PV1a higher than the first voltage Va to the upper adjacent word line. During a first setup period ST1a, the address decoding circuit may apply a first setup voltage SV1a to the upper adjacent word line. The first pre-setup voltage PV1a and the first setup voltage SV1a may respectively correspond to the first pre-setup voltage PV1 and the first setup voltage SV1 of FIG. 3.

Referring to Case B in which the seventh read voltage VRD7 of the upper adjacent word line is a second voltage Vb, during a first pre-setup period PR1b, the address decoding circuit may apply a first pre-setup voltage PV1b higher than the second voltage Vb to the upper adjacent word line. During a first setup period ST1b, the address decoding circuit may apply a first setup voltage SV1b to the upper adjacent word line. The first pre-setup voltage PV1b and the first setup voltage SV1b may respectively correspond to the first pre-setup voltage PV1 and the first setup voltage SV1 of FIG. 3.

As described above, magnitudes of the first pre-setup voltage and the first setup voltage may change depending on a magnitude of the seventh read voltage VRD7. As the magnitude of the seventh read voltage VRD7 increases, the magnitude of the first pre-setup voltage may increase. Also, because the first setup voltage is higher than the first pre-setup voltage, as the magnitude of the first pre-setup voltage increases, the magnitude of the first setup voltage may increase.

That is, in the case where a magnitude of the seventh read voltage VRD7 changes depending on a word line, magnitudes of the first pre-setup voltage and the first setup voltage may be differently set for each word line. For example, referring to FIG. 2, the magnitude of the first pre-setup voltage when the upper adjacent word line is the third word line WL3 may be different from the magnitude of the first pre-setup voltage when the upper adjacent word line is the fifth word line WL5.

Figure 6A:
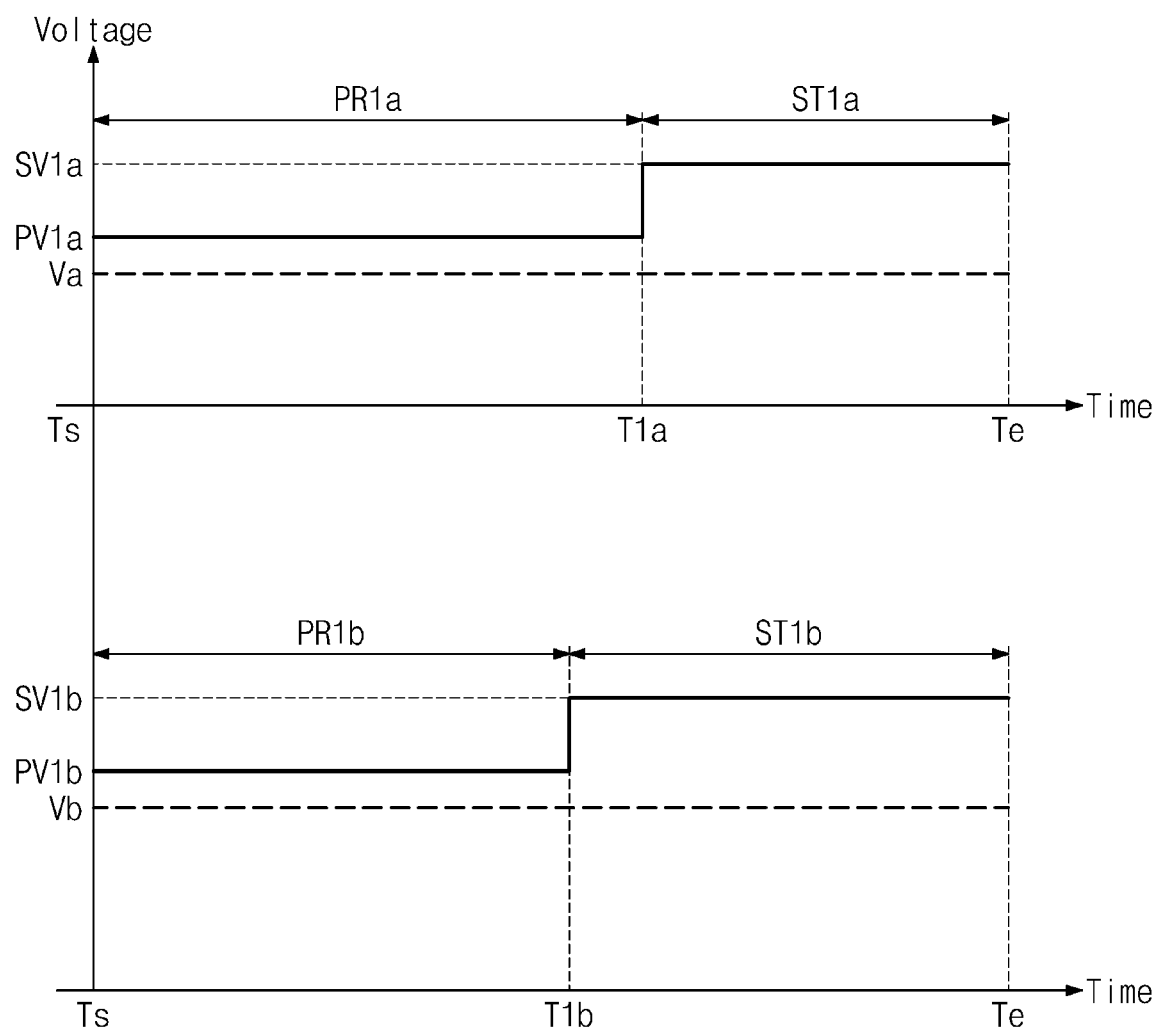
FIG. 6A is a graph of points in time when voltages are applied to an upper adjacent word line, according to an example embodiment.

FIG. 6A is a graph of points in time when voltages are applied to an upper adjacent word line, according to an example embodiment. Start time points of the first setup period are illustrated in FIG. 6A. In FIG. 6A, a horizontal axis denotes a time, and a vertical axis denotes a magnitude of a voltage.

The case where the seventh read voltage VRD7 of the upper adjacent word line is the first voltage Va may correspond to the case (refer to FIG. 5) where the seventh read voltage VRD7 of the upper adjacent word line is the first voltage Va, and the case where the seventh read voltage VRD7 of the upper adjacent word line is the second voltage Vb may correspond to the case (refer to FIG. 5) where the seventh read voltage VRD7 of the upper adjacent word line is the second voltage Vb.

As the first pre-setup voltage becomes smaller, a time at which the address decoding circuit applies the first setup voltage may become later. Referring to the case where the seventh read voltage VRD7 of the upper adjacent word line is the first voltage Va, at a first pre point T1a, the address decoding circuit may apply the first setup voltage SV1a to the upper adjacent word line.

Referring to the case where the seventh read voltage VRD7 of the upper adjacent word line is the second voltage Vb, in a first time point T1b, the address decoding circuit may apply the first pre-setup voltage SV1b to the upper adjacent word line.

When the first pre-setup voltage PV1a is smaller than the first pre-setup voltage PV1b, a time at which the first setup voltage SV1a is applied may be later than a time at which the first setup voltage SV1b is applied. That is, a length of the first pre-setup period PR1a may be longer than a length of the first pre-setup period PR1b.

In some embodiments, in the case where the HCI degradation characteristic of the selected word line WL2 is good, as a length of a period in which the first pre-setup voltage is applied increases, the program operation speed of the selected word line WL2 may become better.

Figure 6B:
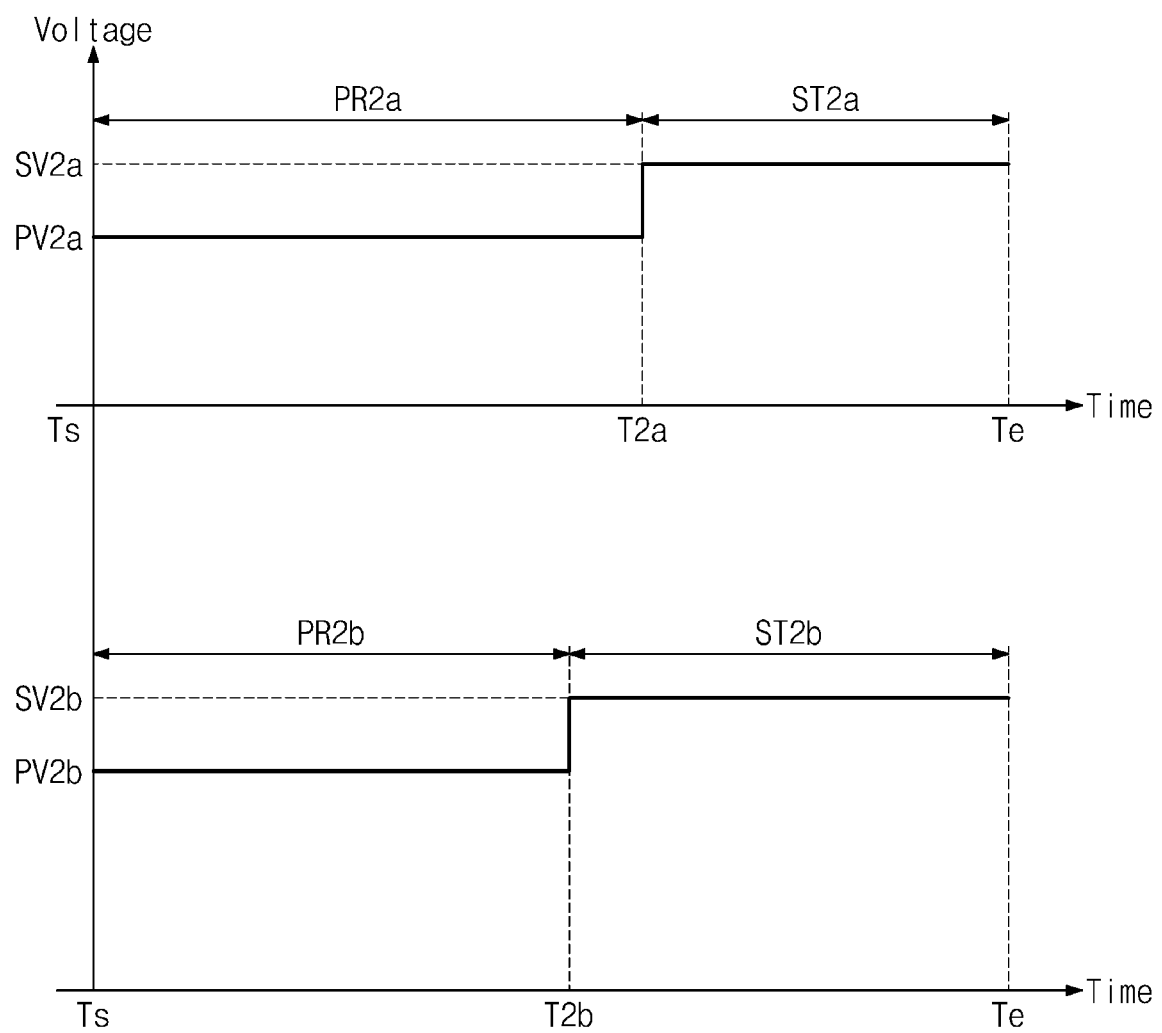
FIG. 6B is a graph of points in time when voltages are applied to a lower adjacent word line, according to an example embodiment.

FIG. 6B is a graph of points in time when voltages are applied to a lower adjacent word line, according to an example embodiment. Start time points of the second setup period are illustrated in FIG. 6B. In FIG. 6B, a horizontal axis denotes a time, and a vertical axis denotes a magnitude of a voltage.

Each of a second pre-setup voltage PV2a and a second pre-setup voltage PV2b may correspond to the second pre-setup voltage PV2 of FIG. 3, and each of a second setup voltage SV2a and a second setup voltage SV2b may correspond to the second setup voltage SV2 of FIG. 3.

Referring to the case where a time at which the second setup voltage SV2a is applied is a second time point T2a, the address decoding circuit may apply the second pre-setup voltage PV2a to the lower adjacent word line during a second pre-setup period PR2a between the start time point Ts and the second time point T2a and may apply the second setup voltage SV2a to the lower adjacent word line during a second setup period ST2a between the second time point T2a and the end time point Te.

Referring to the case where a time at which the second setup voltage SV2b is applied is a second time point T2b, the address decoding circuit may apply the second pre-setup voltage PV2b to the lower adjacent word line during a second pre-setup period PR2b between the start time point Ts and the second time point T2b and may apply the second setup voltage SV2b to the lower adjacent word line during a second setup period ST2b between the second time point T2b and the end time point Te.

In some embodiments, in the case where the HCI degradation characteristic of the selected word line WL2 is good, the program operation speed of the selected word line WL2 in the case where the time at which the second setup voltage SV2a is applied is the second time point T2a may be faster than the program operation speed of the selected word line WL2 in the case where the time at which the second setup voltage SV2b is applied is the second time point T2b.

That is, in the case where the HCI degradation characteristic of the selected word line WL2 is good, as a length of a period in which the second pre-setup voltage is applied increases, the program operation speed of the selected word line WL2 may become better.

Figure 7A:
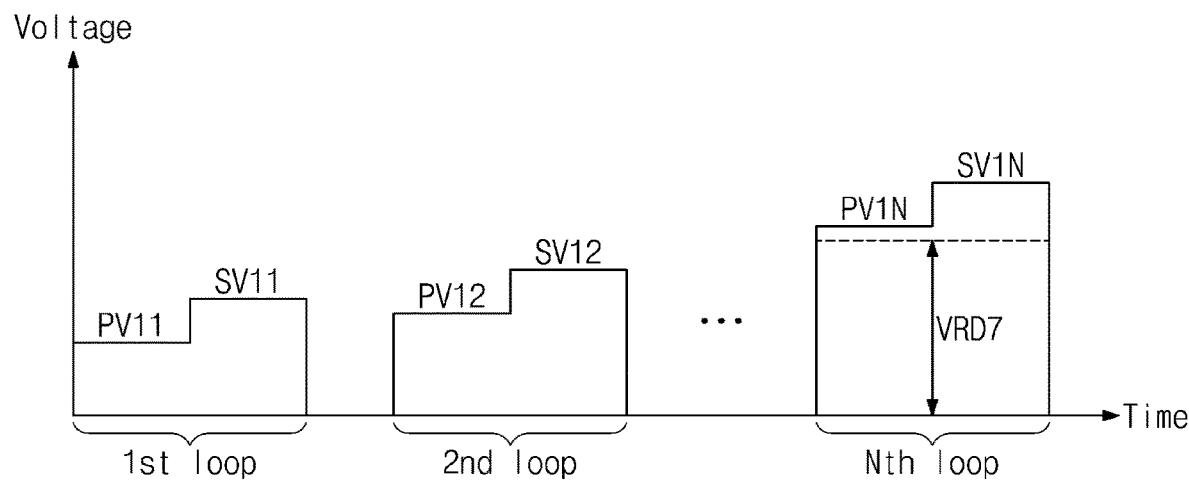
FIG. 7A is a graph of voltages applied to an upper adjacent word line, according to an example embodiment.

FIG. 7A is a graph of voltages applied to an upper adjacent word line, according to an example embodiment. Voltages that are applied to the upper adjacent word line as a program loop is repeated are illustrated in FIG. 7A. In FIG. 7A, a horizontal axis denotes a time, and a vertical axis denotes a magnitude of a voltage.

Each of a first upper pre-setup voltage PV11, a second upper pre-setup voltage PV12, and an N-th upper pre-setup voltage PV1N may correspond to the first pre-setup voltage PV1 of FIG. 3, and each of a first upper setup voltage SV11, a second upper setup voltage SV12, and an N-th upper setup voltage SV1N may correspond to the first setup voltage SV1 of FIG. 3.

A memory device may perform a program operation in an incremental pulse programming (ISPP) manner such that threshold voltages of memory cells connected with a selection word line have a given value. As the program loop is repeated, the threshold voltages of the memory cells connected with the selection word line may gradually increase. The program loop may be repeated until levels of the threshold voltages of all the memory cells connected with the selected word line reach a verify voltage.

The memory device may apply a voltage to the upper adjacent word line in two steps every program loop. In detail, during a first program loop, the memory device may apply the first upper pre-setup voltage PV11 to the upper adjacent word line and may then apply the first upper setup voltage SV11 to the upper adjacent word line. The first upper setup voltage SV11 may be higher than the first upper pre-setup voltage PV11.

When it is determined that the threshold voltages of the memory cells connected with the selected word line are not higher than the verify voltage, the memory device may perform a second program loop. During the second program loop, the memory device may apply the second upper pre-setup voltage PV12 to the upper adjacent word line and may then apply the second upper setup voltage SV12 to the upper adjacent word line. The second upper pre-setup voltage PV12 may be higher than the first upper pre-setup voltage PV11. The second upper setup voltage SV12 may be higher than the second upper pre-setup voltage PV12.

When it is determined that the threshold voltages of the memory cells connected with the selected word line are not higher than the verify voltage, the memory device may perform a third program loop. During the third program loop, the memory device may apply the third upper pre-setup voltage to the upper adjacent word line and may then apply the third upper setup voltage to the upper adjacent word line. The third upper pre-setup voltage may be higher than the second upper pre-setup voltage PV12. The third upper setup voltage may be higher than the third upper pre-setup voltage.

During the N-th program loop, the memory device may apply the N-th upper pre-setup voltage PV1N to the upper adjacent word line and may then apply the N-th upper setup voltage SV1N to the upper adjacent word line. In an embodiment, during the N-th program loop, the memory device may apply the N-th upper pre-setup voltage PV1N higher than the seventh read voltage VRD7 of the upper adjacent word line to the upper adjacent word line and may then apply the N-th upper setup voltage SV1N to the upper adjacent word line. The N-th program loop may correspond to a program period where the memory cells connected with the selected word line are completely programmed. The N-th upper pre-setup voltage PV1N may be higher than the (N−1)-th upper pre-setup voltage. The N-th upper setup voltage SV1N may be higher than the N-th upper pre-setup voltage PV1N.

That is, as the program loop is repeated, a magnitude of an upper pre-setup voltage that is applied to the upper adjacent word line may increase until the levels of the threshold voltages of all the memory cells connected with the selected word line reach the verify voltage.

However, the magnitudes of the first to (N−1)-th upper pre-setup voltages applied in the first to (N−1)-th program loops may be smaller than the seventh read voltage VRD7 of the memory cells connected with the upper adjacent word line. While the program operation is performed based on the ISPP manner, as the address decoding circuit applies a voltage to the upper adjacent word line in two steps every program loop, the number of program loops to be performed may decrease. As the number of program loops to be performed decreases, a time during which the memory device performs the program operation on the selected word line may decrease.

Figure 7B:
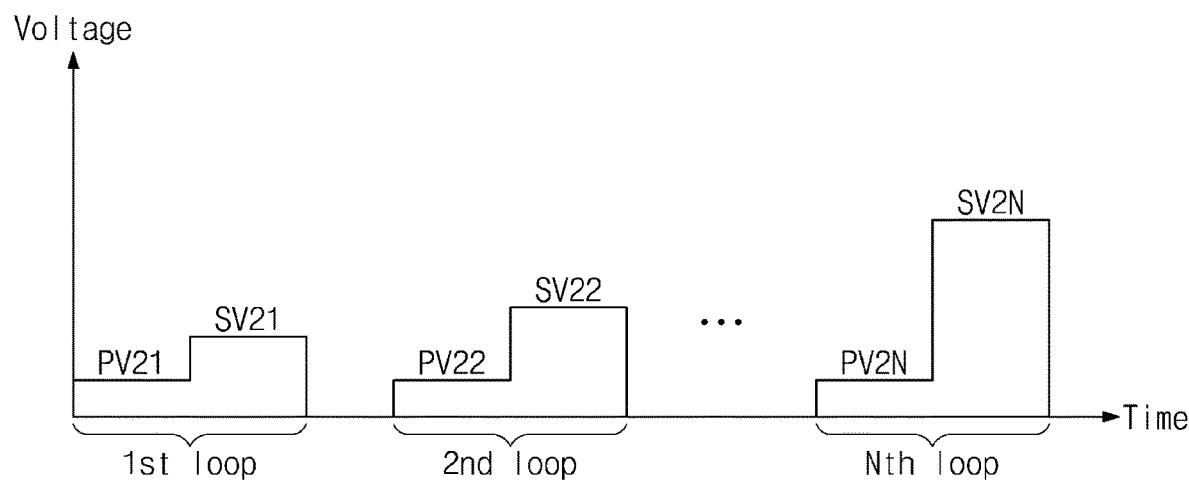
FIG. 7B is a graph of voltages applied to a lower adjacent word line, according to an example embodiment.

FIG. 7B is a graph of voltages applied to a lower adjacent word line, according to an example embodiment. Voltages that are applied to the lower adjacent word line as a program loop is repeated are illustrated in FIG. 7B. In FIG. 7B, a horizontal axis denotes a time, and a vertical axis denotes a magnitude of a voltage.

Each of a first lower pre-setup voltage PV21, a second lower pre-setup voltage PV22, and an N-th lower pre-setup voltage PV2N may correspond to the second pre-setup voltage PV2 of FIG. 3, and each of a first lower setup voltage SV21, a second lower setup voltage SV22, and an N-th lower setup voltage SV2N may correspond to the second setup voltage SV2 of FIG. 3.

The memory device may apply a voltage to the lower adjacent word line in two steps every program loop. In detail, during the first program loop, the memory device may apply the first lower pre-setup voltage PV21 to the lower adjacent word line and may then apply the first lower setup voltage SV21 to the lower adjacent word line.

The first lower pre-setup voltage PV21 may be lower than the first read voltage VRD1 of memory cells connected with a selected word line. The first lower setup voltage SV21 may be higher than the first lower pre-setup voltage PV21. When it is determined that the threshold voltages of the memory cells connected with the selected word line are not higher than the verify voltage, the memory device may perform the second program loop.

During the second program loop, the memory device may apply the second lower pre-setup voltage PV22 to the lower adjacent word line and may then apply the second lower setup voltage SV22 to the lower adjacent word line. A magnitude of the second lower pre-setup voltage PV22 may be equal to a magnitude of the first lower pre-setup voltage PV21. The second lower setup voltage SV22 may be higher than the first lower setup voltage SV21.

When it is determined that the threshold voltages of the memory cells connected with the selected word line are not higher than the verify voltage, the memory device may perform the third program loop.

During the N-th program loop, the memory device may apply the N-th lower pre-setup voltage PV2N to the lower adjacent word line and may then apply the N-th lower setup voltage SV2N to the lower adjacent word line. Herein, "N" may be a natural number of 3 or more. A magnitude of the N-th lower pre-setup voltage PV2N may be equal to the magnitude of the first lower pre-setup voltage PV21. A magnitude of the N-th lower setup voltage SV2N may be greater than a magnitude of the (N−1)-th lower setup voltage.

While the program operation is performed on the selected word line in the ISPP manner, as the address decoding circuit applies a voltage to the lower adjacent word line in two steps every program loop, the number of program loops to be performed may decrease. That is, a time during which the program operation is performed on the selected word line may decrease.

Figure 8:
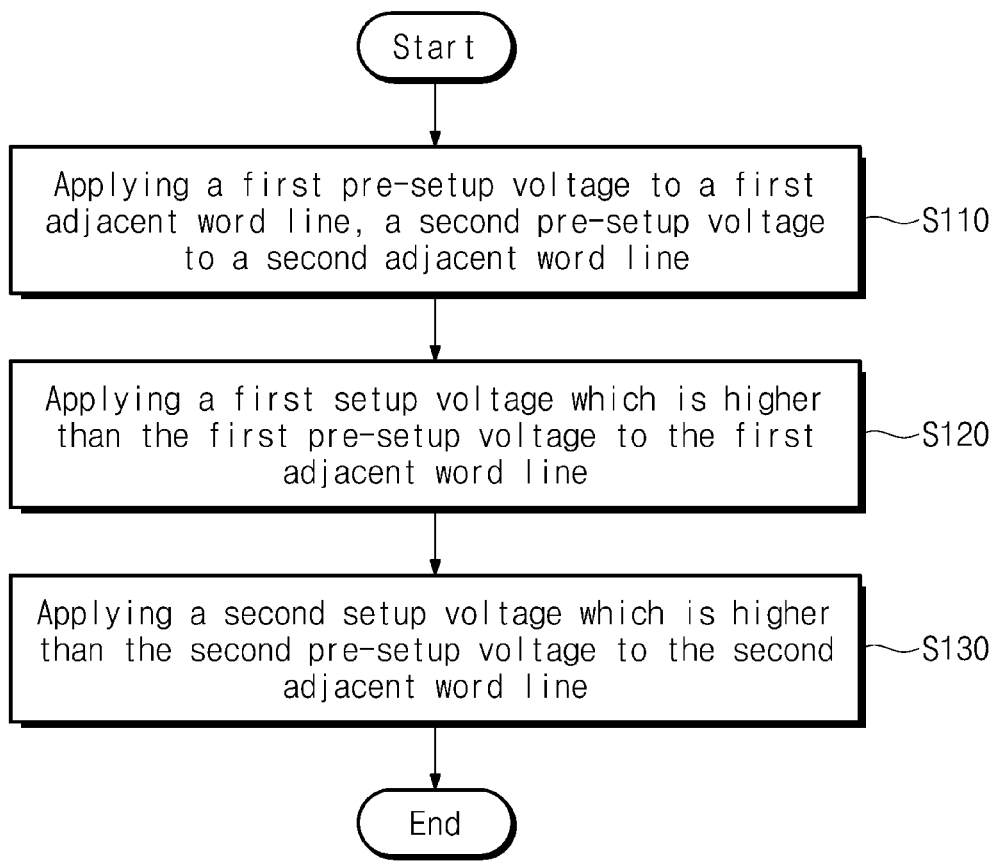
FIG. 8 is a flowchart of an method of a memory device according to an example embodiment.

FIG. 8 is a flowchart of an method of a memory device according to an example embodiment. An operating method of a memory device according to some embodiments of the present disclosure will be described with reference to FIG. 8. The memory device may correspond to the memory device 100 of FIG. 1.

In operation S110, during the setup period in which a selected word line is set up, the memory device may apply a first pre-setup voltage to an upper adjacent word line and may apply a second pre-setup voltage to a lower adjacent word line. The first pre-setup voltage may be higher than a read voltage corresponding to a seventh program state of memory cells connected with the upper adjacent word line. The second pre-setup voltage may be lower than a read voltage corresponding to a first program state of the memory cells connected with the selected word line. The first pre-setup voltage may be higher than the second pre-setup voltage.

In operation S120, the memory device may apply a first setup voltage higher than the first pre-setup voltage to the upper adjacent word line. That is, the memory device may apply a voltage to the upper adjacent word line in two steps during the setup period.

In operation S130, the memory device may apply a second setup voltage higher than the second pre-setup voltage to the lower adjacent word line. The first pre-setup voltage may be higher than the second pre-setup voltage. That is, the memory device may apply a voltage to the lower adjacent word line in two steps during the setup period.

According to embodiments of the present disclosure, a memory device that individually applies voltages to word lines adjacent to a selected word line and an operating method thereof are provided.

According to some embodiments of the present disclosure, as a voltage is applied to each of upper and lower adjacent word lines adjacent to a selected word line in two steps, the HCI may be suppressed; as the upper and lower adjacent word lines are individually controlled, a setup period of the selected word line may be shortened.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. A memory device comprising:
   a memory block comprising a first adjacent word line, a selected word line, and a second adjacent word line provided in a direction perpendicular to a substrate; and
   an address decoding circuit,
   wherein, in a first setup period in which the selected word line is set up for a programming operation, the first setup period comprising a start time point and an end time point, the address decoding circuit is configured to:
   apply a first pre-setup voltage to the first adjacent word line between the start time point of the first setup period and a first time point;
   apply a first setup voltage that is higher than the first pre-setup voltage to the first adjacent word line between the first time point and the end time point of the first setup period;
   apply a second pre-setup voltage to the second adjacent word line between the start time point of the first setup period and a second time point; and
   apply a second setup voltage that is higher than the second pre-setup voltage to the second adjacent word line between the second time point and the end time point of the first setup period, and wherein the first pre-setup voltage is higher than the second pre-setup voltage.

2. The memory device of claim 1, wherein a length of a period in which the second pre-setup voltage is applied is longer than a length of a period in which the first pre-setup voltage is applied.

3. The memory device of claim 1, wherein the first pre-setup voltage is higher than a read voltage of a seventh program state of memory cells connected to the first adjacent word line.

4. The memory device of claim 3, wherein a length of a period in which the first pre-setup voltage is applied increases as a level of the read voltage decreases.

5. The memory device of claim 1, wherein the second pre-setup voltage is lower than a read voltage of a first program state of memory cells connected to the selected word line.

6. The memory device of claim 1, wherein a program operation speed of the selected word line increases as a length of a period in which the second pre-setup voltage is applied increases.

7. The memory device of claim 1, wherein the second adjacent word line is closer to the substrate than the first adjacent word line.

8. The memory device of claim 1, wherein, in a second setup period, the address decoding circuit is further configured to:
apply a third pre-setup voltage to the first adjacent word line; and
apply a third setup voltage that is higher than the third pre-setup voltage to the first adjacent word line,
wherein the first pre-setup voltage is lower than the third pre-setup voltage,
wherein the first setup voltage is lower than the third setup voltage,
wherein the third pre-setup voltage is higher than a read voltage of a seventh program state of memory cells connected to the first adjacent word line, and
wherein the second setup period corresponds to a loop period in which memory cells connected to the selected word line are programmed.

9. The memory device of claim 1, wherein, in a second setup period, the address decoding circuit is further configured to:
apply the second pre-setup voltage to the second adjacent word line; and
apply a fourth setup voltage that is higher than the second setup voltage to the second adjacent word line.

10. A method of operating a memory device that comprises a first adjacent word line, a selected word line, and a second adjacent word line provided in a direction perpendicular to a substrate, the method comprising:
applying a first pre-setup voltage to the first adjacent word line between a start time point and a first time point of a first setup period in which the selected word line is set up for a programming operation;
applying a second pre-setup voltage to the second adjacent word line between the start time point and a second time point of the first setup period;
applying a first setup voltage that is higher than the first pre-setup voltage to the first adjacent word line between the first time point and an end time point of the first setup period; and
applying a second setup voltage that is higher than the second pre-setup voltage to the second adjacent word line between the second time point and the end time point of the first setup period,
wherein the first pre-setup voltage is higher than the second pre-setup voltage.

11. The method of claim 10, wherein a length of a period in which the second pre-setup voltage is applied is longer than a length of a period in which the first pre-setup voltage is applied.

12. The method of claim 10, wherein the first pre-setup voltage is higher than a read voltage of a seventh program state of memory cells connected to the first adjacent word line.

13. The method of claim 12, wherein a length of a period in which the first pre-setup voltage is applied increases as a level of the read voltage decreases.

14. The method of claim 12, wherein the second pre-setup voltage is lower than a read voltage of a first program state of memory cells connected to the selected word line.

15. The method of claim 10, wherein a program operation speed of the selected word line increases as a length of a period in which the second pre-setup voltage is applied increases.

16. The method of claim 10, further comprising:
in a second setup period, applying a third pre-setup voltage to the first adjacent word line; and
applying a third setup voltage that is higher than the third pre-setup voltage to the first adjacent word line,
wherein the first pre-setup voltage is lower than the third pre-setup voltage;
wherein the first setup voltage is lower than the third setup voltage,
wherein the third pre-setup voltage is higher than a read voltage of a seventh program state of memory cells connected to the first adjacent word line, and
wherein the second setup period corresponds to a loop period in which memory cells connected to the selected word line are programmed.

17. The method of claim 10, further comprising:
in a second setup period, applying the second pre-setup voltage to the second adjacent word line; and
applying a fourth setup voltage higher than the second setup voltage to the second adjacent word line.

18. A memory device comprising:
a memory block comprising a first adjacent word line, a selected word line, and a second adjacent word line provided in a direction perpendicular to a substrate; and
an address decoding circuit configured to;
set up the selected word line in a first setup period between a start time point and an end time point, the first setup period being a period in which the selected word line is set up for a programming operation;
apply a first pre-setup voltage to the first adjacent word line in a second period between the start time point of the first setup period and a first time point;
apply a first setup voltage that is higher than the first pre-setup voltage to the first adjacent word line in a third period between the first time point and the end time point of the first setup period;
apply a second pre-setup voltage to the second adjacent word line in a fourth period between the start time point of the first setup period and a second time point; and
apply a second setup voltage that is higher than the second pre-setup voltage to the second adjacent word line in a fifth period between the second time point and the end time point of the first setup period,
wherein the first pre-setup voltage is higher than the second pre-setup voltage.

19. The memory device of claim 18, wherein the second time point is later than the first time point.

20. The memory device of claim 18, wherein the first pre-setup voltage is higher than a read voltage of a seventh program state of memory cells connected to the first adjacent word line.

* * * * *